US008968473B2

(12) United States Patent
Poppe et al.

(10) Patent No.: US 8,968,473 B2
(45) Date of Patent: Mar. 3, 2015

(54) STACKABLE MULTI-PORT GAS NOZZLES

(75) Inventors: Steve Poppe, Pleasanton, CA (US); Yan Rozenzon, San Carlos, CA (US); Peijun Ding, Saratoga, CA (US)

(73) Assignee: Silevo, Inc., Fremont, CA (US)

( * ) Notice: Subject to any disclaimer, the term of this patent is extended or adjusted under 35 U.S.C. 154(b) by 934 days.

(21) Appl. No.: 12/880,941

(22) Filed: Sep. 13, 2010

(65) Prior Publication Data
US 2011/0067632 A1 Mar. 24, 2011

Related U.S. Application Data

(60) Provisional application No. 61/244,341, filed on Sep. 21, 2009.

(51) Int. Cl.
C23C 16/455 (2006.01)
C23C 16/458 (2006.01)
C23C 16/44 (2006.01)

(52) U.S. Cl.
CPC ....... *C23C 16/4412* (2013.01); *C23C 16/45521* (2013.01); *C23C 16/45576* (2013.01); *C23C 16/4587* (2013.01)
USPC .......................................... 118/715

(58) Field of Classification Search
CPC ..................... C23C 16/45576; C23C 16/4587; C23C 16/45521; C30B 25/14; C30B 25/12
USPC ..................... 118/723 VE, 723 DC, 728, 722; 156/345.33–345.34
See application file for complete search history.

(56) References Cited

U.S. PATENT DOCUMENTS

| | | | | | |
|---|---|---|---|---|---|
| 4,858,558 | A | * | 8/1989 | Ohmura et al. | 118/725 |
| 5,074,245 | A | * | 12/1991 | Ota et al. | 118/719 |
| 5,119,540 | A | * | 6/1992 | Kong et al. | 118/730 |
| 5,269,847 | A | * | 12/1993 | Anderson et al. | 118/715 |
| 5,505,778 | A | * | 4/1996 | Ono et al. | 438/798 |
| 6,262,393 | B1 | * | 7/2001 | Imai et al. | 219/390 |
| 6,478,923 | B1 | * | 11/2002 | Igarashi | 156/345.26 |
| 2005/0016956 | A1 | * | 1/2005 | Liu et al. | 216/67 |

FOREIGN PATENT DOCUMENTS

| | | | |
|---|---|---|---|
| JP | 11288890 A | 10/1999 |
| JP | 2003158054 A | 5/2003 |
| JP | 2003277936 A | 10/2003 |
| JP | 2006080098 A | 3/2006 |
| KR | 2006117134 A | 11/2006 |

* cited by examiner

*Primary Examiner* — Keath Chen
*Assistant Examiner* — Aiden Lee
(74) *Attorney, Agent, or Firm* — Shun Yao; Park, Vaughan, Fleming & Dowler LLP

(57) ABSTRACT

One embodiment provides a reactor for material deposition. The reactor includes a chamber and at least one gas nozzle. The chamber includes a pair of susceptors, each having a front side and a back side. The front side mounts a number of substrates. The susceptors are positioned vertically so that the front sides of the susceptors face each other, and the vertical edges of the susceptors are in contact with each other, thereby forming a substantially enclosed narrow channel between the substrates mounted on different susceptors. The gas nozzle includes a gas-inlet component situated in the center and a detachable gas-outlet component stacked around the gas-inlet component. The gas-inlet component includes at least one opening coupled to the chamber, and is configured to inject precursor gases into the chamber. The detachable gas-outlet component includes at least one opening coupled to the chamber, and is configured to output exhaust gases from the chamber.

14 Claims, 5 Drawing Sheets

STACKABLE MULTI-PORT GAS NOZZLES

RELATED APPLICATION

This application claims the benefit of U.S. Provisional Application No. 61/244,341, entitled "STACKING CONCENTRIC MULTI PORT GAS-EXHAUST NOZZLE" by inventors Steve Poppe, Yan Rozenzon, and Peijun Ding, filed 21 Sep. 2009.

This invention was made with government support under DE-EE0000589 awarded by Department of Energy. The government has certain rights in the invention.

BACKGROUND

1. Field

This disclosure is generally related to deposition systems. More specifically, this disclosure is related to a stackable multi-port gas nozzle used in a deposition reactor.

2. Related Art

The negative environmental impact caused by the use of fossil fuels and their rising cost have resulted in a dire need for cleaner, cheaper alternative energy sources. Among different forms of alternative energy sources, solar power has been favored for its cleanness and wide availability.

A solar cell converts light into electricity using the photoelectric effect. There are several basic solar cell structures, including a single p-n junction, p-i-n/n-i-p, and multi-junction. A typical single p-n junction structure includes a p-type doped layer and an n-type doped layer of similar material. A heterojunction structure includes at least two layers of materials of different bandgaps. A p-i-n/n-i-p structure includes a p-type doped layer, an n-type doped layer, and an optional intrinsic (undoped) semiconductor layer (the i-layer) sandwiched between the p-layer and the n-layer. A multi junction structure includes multiple semiconductor layers of different bandgaps stacked on top of one another.

In a solar cell, light is absorbed near the p-n junction generating carriers. The carriers diffuse into the p-n junction and are separated by the built-in electric field, thus producing an electrical current across the device and external circuitry. An important metric in determining a solar cell's quality is its energy-conversion efficiency, which is defined as the ratio between power converted (from absorbed light to electrical energy) and power collected when the solar cell is connected to an electrical circuit.

Materials that can be used to construct solar cells include amorphous silicon (a-Si), polycrystalline silicon (poly-Si), crystalline silicon (c-Si), cadmium telluride (CdTe), etc. FIG. 1 illustrates an exemplary crystalline-silicon thin-film solar cell. Solar cell 100 includes a low-grade crystalline-Si substrate 102, a p-type doped single-crystal Si layer 104, an $n^+$ silicon emitter layer 106, front electrodes 108, and an Al back electrode 110. Arrows in FIG. 1 indicate incident sunlight.

Based on industrial surveys, c-Si wafer-based solar cells dominate nearly 90% of the market. However, the cost of producing c-Si wafer-based solar cells is high, and the waste of Si material during the ingot-cutting process and the wafer-polishing process has caused a bottleneck in the supply of crystalline-Si wafers. Due to the soaring price and the supply shortage of Si material, there has been a great interest in alternative ways to manufacture solar cells. Recently, photovoltaic thin-film technology has been drawing vast interest because it can significantly reduce the amount of material used, thus lowering the cost of solar cells. Among various competing technologies, single-crystal Si thin-film solar cells have drawn great interest for their low cost and high efficiency.

Single-crystal Si thin-film solar cells can be created using conventional semiconductor epitaxy technologies which not only reduce manufacturing costs but also enable flexible doping levels in the emitter, absorber and back surface field of the solar cell, thus enhancing its efficiency. Single-crystal Si thin-film solar cells with an efficiency as high as 17% have been demonstrated in research labs (see M. Reutuer et al., "17% Efficient 50 µm Thick Solar Cells," *Technical Digest, 17th International Photovoltaic Science and Engineering Conference*, Fukuoka, Japan, p. 424).

A high-quality single-crystal Si thin film can be produced using Si epitaxy, which has been widely used in the semiconductor industry to create a high-quality single-crystal Si layer for CMOS integrated circuits, power devices and high-voltage discrete devices. Among possible Si epitaxial deposition techniques, trichlorosilane (TCS) based chemical vapor deposition (CVD) can provide a deposition rate of up to 10 µm/min. Therefore, it is possible to achieve a high-throughput and low-cost epitaxial process for solar cell application.

However, there is a lack of suitable Si epitaxy tools that can meet the demand for high throughput and low deposition cost for Si film layers with thicknesses up to several tens of microns, as required by the solar cell industry. Existing Si epitaxy tools, such as AMC7810™ and Centura 5200™ by Applied Materials, Inc., of Santa Clara, Calif., US; MT7700™ by Moore Epitaxial, Inc., of Tracy, Calif., US; PE2061™ by LPE Epitaxial Technology of Italy; and Epsilon 3200™ by ASM International of the Netherlands, are optimized for the needs of semiconductor device manufacturing. Although these epitaxial tools can deliver Si films with the highest quality, these tools are not compatible, in terms of throughput and gas conversion efficiency, with the economics of the solar cell industry.

FIG. 2 presents a diagram illustrating the structure of an existing barrel epitaxial reactor (prior art), such as that used for the batch processing of multiple wafers. Barrel reactor 200 includes a reaction chamber 202, which has a gas inlet 204 at the top and a vent 206 at the bottom. A vertically positioned susceptor 208 holds a number of wafers, such as wafer 210. Radio frequency (RF) heating coils 212 radiate heat onto the susceptor and wafers. Although barrel reactor 200 can batch process multiple wafers, the number of wafers it can process is limited by the architect of the system, the size of the chamber, and the design of the susceptor. Once built, it is difficult to modify the reactor or the susceptor to accommodate more wafers. In addition, the susceptor needs to be rotated during deposition in order to achieve a better uniformity. Because in barrel reactor 200 the process gas is delivered from gas inlet 204 to inner chamber walls and wafers with bottom exhaust, deposition can occur on the inner chamber walls, thus reducing radiant heating to wafers and requiring frequent cleaning cycles of quartz chambers. These limitations make it difficult to achieve a scalable high throughput system.

U.S. Pat. No. 6,399,510 proposed a reaction chamber that provides a bi-directional process gas flow to increase uniformity without the need for rotating susceptors. However, it does not solve the issues of low throughput, low reaction gas conversion rate, low power utilization efficiency, minimal Si deposition on the quartz chamber, and processing scalability. In addition, using the same gas lines for gas inlet and outlet increases the risk of contamination and re-deposition.

SUMMARY

One embodiment of the present invention provides a reactor for material deposition. The reactor includes a chamber and at least one gas nozzle. The chamber includes a pair of susceptors situated inside the chamber. Each susceptor has a front side and a back side, and the front side mounts a number of substrates. The susceptors are positioned vertically in such a way that the front sides of the susceptors face each other, and the vertical edges of the susceptors are in contact with each other, thereby forming a substantially enclosed narrow channel between the substrates mounted on different susceptors. The gas nozzle includes a gas-inlet component situated in the center of the gas nozzle and a detachable gas-outlet component stacked around the gas-inlet component. The gas-inlet component includes at least one opening coupled to the chamber, and is configured to inject precursor gases into the chamber. The detachable gas-outlet component includes at least one opening coupled to the chamber, and is configured to output exhaust gases from the chamber.

In a variation on the embodiment, the susceptors are formed using SiC-coated graphite or monolithic SiC.

In a variation on the embodiment, the cross section of the susceptors is U-shaped, and the wafer-holding sides of the susceptors are the inner surfaces of the "U."

In a variation on the embodiment, the chamber is made of a material that comprises quartz.

In a variation on the embodiment, the gas nozzle further includes a second detachable gas-inlet component stacked around the detachable gas-outlet component. The second detachable gas-inlet component includes at least one opening coupled to the chamber, and the second detachable gas-inlet component is configured to inject purge gas into the chamber, thereby reducing deposition on walls of the chamber.

In a further variation, the second detachable gas-inlet component is configured to inject the purge gas into a space between the walls of the chamber and the back-side surfaces of the susceptors.

In a further variation on the embodiment, the purge gas flows between the inner walls of the second detachable gas-inlet component and the outer walls of the detachable gas-outlet component.

In a variation on the embodiment, the gas-inlet component is configured to inject precursor gas into the enclosed narrow channel.

In a variation on the embodiment, the exhaust gas flows between the inner walls of the detachable gas-outlet component and the outer walls of the gas-inlet component.

In a variation on the embodiment, at least one component of the gas nozzle is made of a material that comprises quartz.

BRIEF DESCRIPTION OF THE FIGURES

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

Overview

Embodiments of the present invention provide a stackable multi-port gas nozzle, which can be used in a material deposition reactor. The gas nozzle includes a number of stackable components; each can be used as a port for gas delivery or exhaust. A gas-inlet port delivers precursor gas to an inner channel formed by two U-shaped susceptors with wafers facing each other. A gas-outlet port outputs exhaust from the reactor chamber. In addition, a third gas-inlet port delivers a purge gas between the chamber walls and the back side of the susceptors, significantly reducing deposition on the chamber wall.

Susceptors

Figure 1:
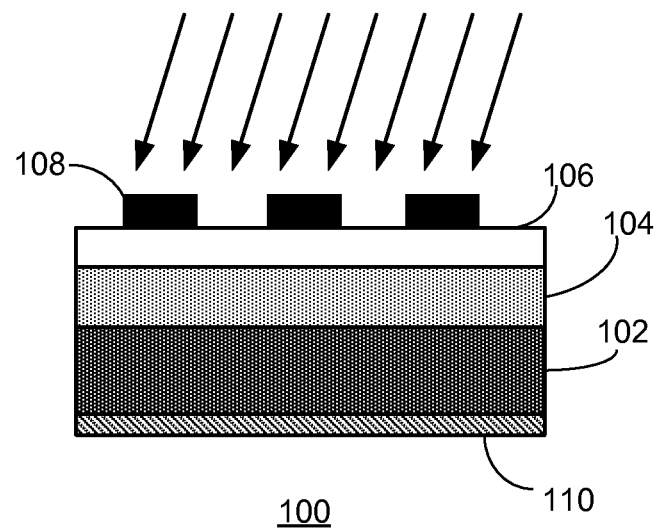
FIG. 1 presents a diagram illustrating the structure of an exemplary crystalline-Si thin-film solar cell.
Figure 2:
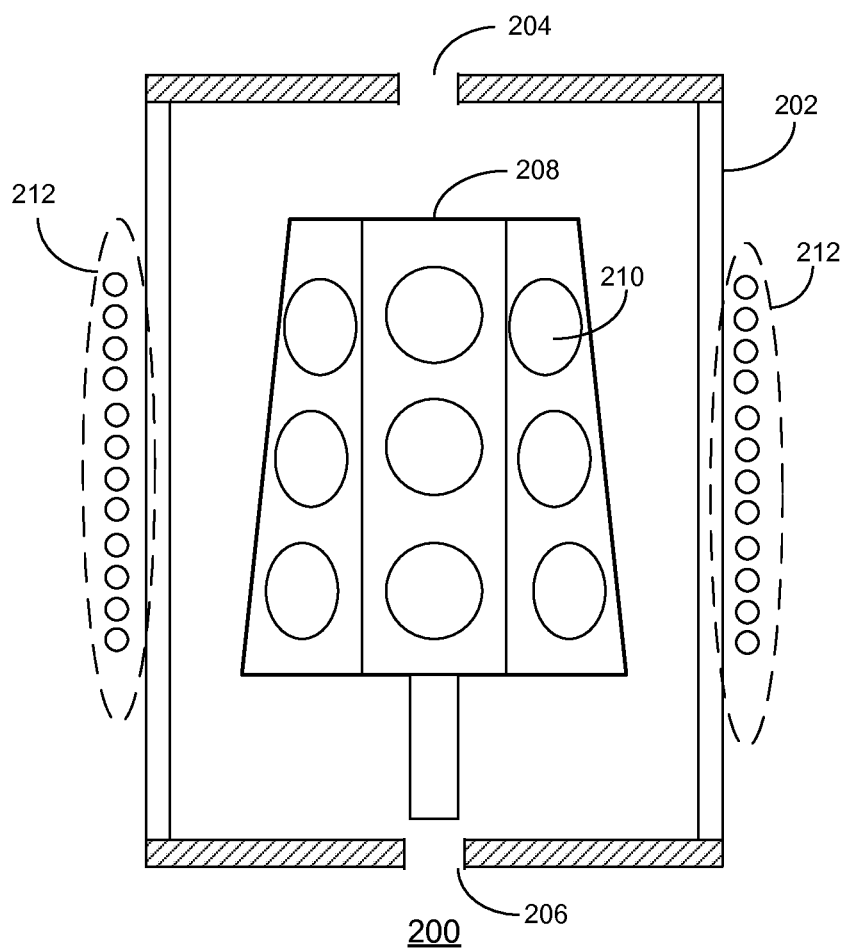
FIG. 2 presents a diagram illustrating an existing barrel reactor (prior art).
Figure 3A:
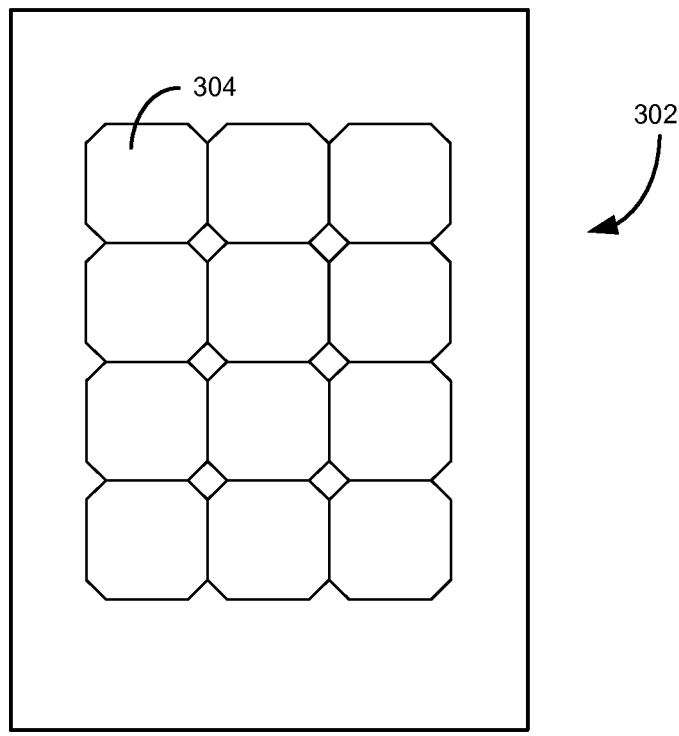
FIG. 3A presents a diagram illustrating the front side of a susceptor in accordance with an embodiment of the present invention.

FIG. 3A presents a diagram illustrating the front side of a susceptor in accordance with an embodiment of the present invention. During deposition, a susceptor 302 is placed vertically inside the reactor chamber. Note that, to avoid heat absorption by chamber walls, the reactor chamber is formed using a material that is transparent to radiant heat. In one embodiment, the reactor chamber is formed using quartz. By contrast, susceptor 302 is formed using a material that is opaque and absorbs radiant heat energy, such as SiC-coated graphite and monolithic SiC. In one embodiment, susceptor 302 is formed using SiC-coated graphite. As a result, most of the radiant heat from lamp-heating units located outside the reactor chamber is absorbed by susceptor 302.

Figure 3B:
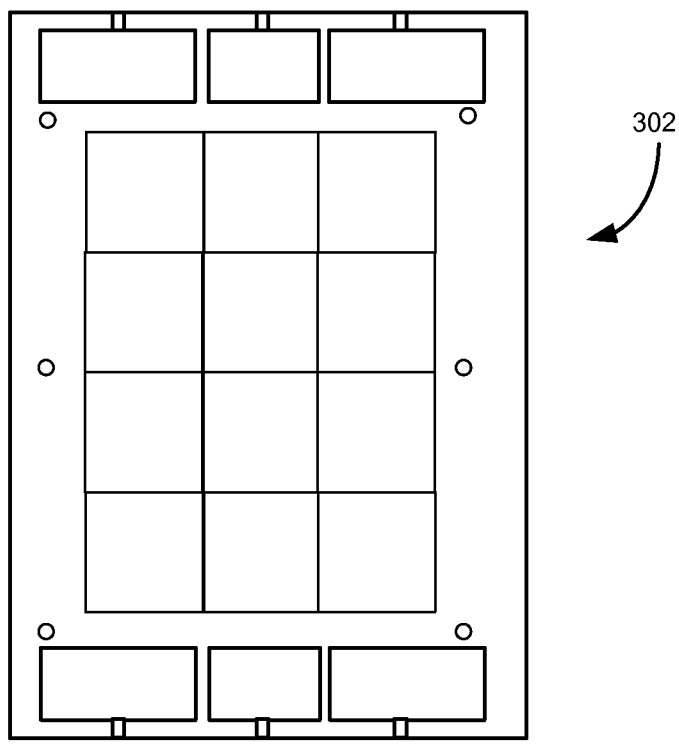
FIG. 3B presents a diagram illustrating the back side of a susceptor in accordance with an embodiment of the present invention.

The front side of susceptor 302 includes a set of pockets, such as pocket 304, for supporting substrates to be deposited. The shape of the bottom of the pockets is carefully designed to ensure a good thermal contact between the susceptor and the substrates. In one embodiment, the bottom of pocket 304 has a contour shape. Depending on the size of susceptor 302, various numbers of substrates can fit onto susceptor 302. In one embodiment, susceptor 302 includes 12 pockets for supporting 12 125×125 $mm^2$ substrates. FIG. 3B presents a diagram illustrating the back side of a susceptor in accordance with an embodiment.

Figure 3C:
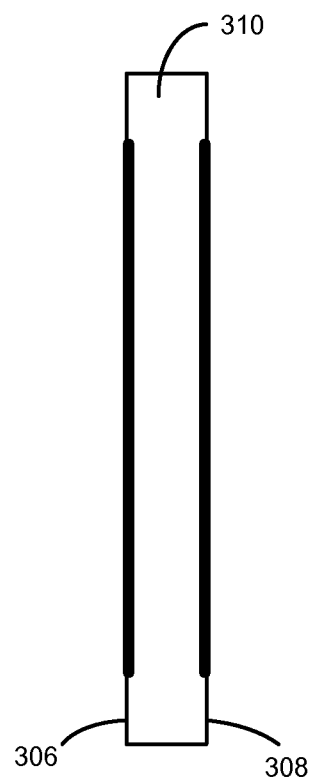
FIG. 3C demonstrates the side view of a pair of susceptors in accordance with an embodiment of the present invention.
Figure 3D:
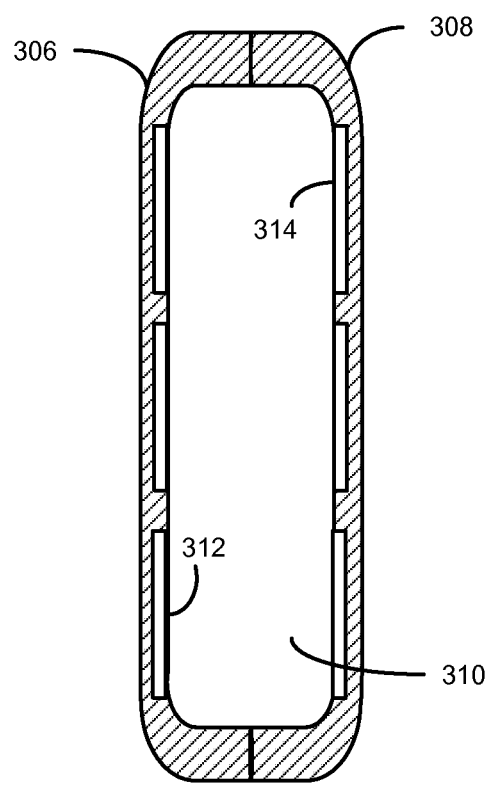
FIG. 3D presents a diagram illustrating the top view of a pair of susceptors in accordance with an embodiment of the present invention.

FIG. 3C demonstrates the side view of a pair of susceptors in accordance with an embodiment of the present invention. In FIG. 3C, a pair of susceptors, susceptor 306 and susceptor 308, are placed vertically inside the reaction chamber. A narrow channel 310 is formed between susceptors 306 and 308. FIG. 3D presents a diagram illustrating the top view of a pair of susceptors in accordance with an embodiment of the present invention. FIG. 3D illustrates that the cross sections of susceptors 306 and 308 are U-shaped. The vertical edges of susceptors 306 and 308 are in contact with each other forming an enclosed narrow channel 310. The wafers mounted on susceptors 306 and 308, such as wafers 312 and 314, are facing inward to narrow channel 310. As a result, during deposition, the precursor gases, such as TCS, can be contained within narrow channel 310. Other examples of precursor gases include, but are not limited to: $SiH_4$, $SiH_2Cl_2$, and $SiCl_4$. In addition to the "U" shape, the cross sections of susceptors 306 and 308 can form other shapes, include but are not limited to: half circle, half eclipse, and other regular or irregular shapes. Note that the front sides (i.e., the wafer-holding sides) of susceptors 306 and 308 are facing each other. Thus, the deposition substrates, such as substrates 312 and 314, have their deposition surfaces surrounding channel 310, which contains the precursor gases and keeps them from depositing material on the inner walls of the reactor chamber. Such a configuration can increase the TCS gas utilization rate significantly, because the probability for the TCS gas to successfully deposit Si on substrate surfaces is now much higher. The increased deposition probability results from the precursor gases being surrounded by deposition surfaces, as well as the reduced deposition on the inner walls of the reactor chamber.

Nozzle

In a solar cell, film uniformity greatly impacts the solar cell's efficiency. In a traditional epitaxial system, it has been difficult to achieve good deposition uniformity and a high reaction-gas-utilization rate at the same time. Substrate rotation can be used to improve uniformity. However, it becomes increasingly difficult to rotate substrates in a large batch reactor. To achieve better deposition uniformity, in one embodiment, precursor gases, such as TCS and $H_2$, are injected into the channel formed by the two susceptors from the top and bottom of the reactor chamber, alternately. To do so, two nozzles are installed, one on the top of the reactor chamber and one on the bottom. Similarly to the reactor chamber, the nozzles are made of material that is resistant to radiant heat. In one embodiment, the nozzles, or at least portions of the nozzles, are formed using quartz.

Each nozzle includes a gas-inlet port for injecting precursor gas. In addition, each nozzle also includes a gas-outlet port for exhaust. To simplify the design and fabrication of the nozzle, the gas-inlet and gas-outlet ports are made of detachable components. In one embodiment, they can be stacked together with the gas-inlet port located inside of the gas-outlet port. Note that the gas-inlet port for the precursor and the gas-outlet port for the exhaust are both coupled to the channel formed by the two susceptors.

In addition to a gas-inlet port for precursor gas and a gas-outlet port for exhaust, each nozzle also includes a third port which delivers a purge gas between the chamber walls and the back side of the susceptors. The existence of the purge gas can significantly reduce deposition on the chamber walls. This purge-gas-inlet port is also made of a detachable component and can be stacked outside of the gas-outlet port for exhaust.

Figure 4A:
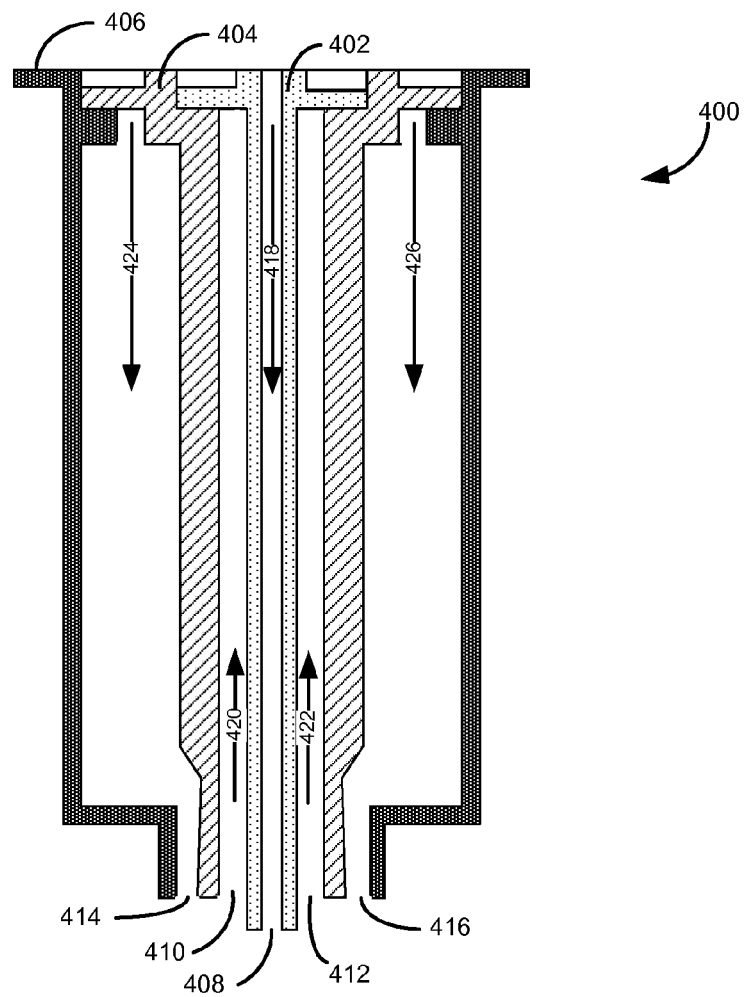
FIG. 4A presents the cross-sectional view of the stackable multi-port nozzle in the vertical direction in accordance with an embodiment of the present invention.

FIG. 4A presents the cross-sectional view of the stackable multi-port nozzle in the vertical direction in accordance with an embodiment of the present invention. A gas nozzle 400 includes three detachable components, including precursor-gas-inlet component 402, exhaust component 404, and purge-gas-inlet component 406. Precursor-gas-inlet component 402 is located at the center of nozzle 400, and includes an opening 408 at the bottom coupled to the narrow channel formed by the pair of susceptors to allow the precursor gas to enter the narrow channel during deposition. Exhaust component 404 can be stacked around the precursor-gas-inlet component 402. In one embodiment, the inner walls of exhaust component 404 and the outer walls of precursor-gas-inlet component 402 form an enclosed space to allow the flow of the exhaust. In a further embodiment, exhaust component 404 includes a number of openings, such as openings 410 and 412, at the bottom to allow the exhaust to exit the reactor chamber. During deposition, the openings on exhaust component 404, such as openings 410 and 412, remain closed when opening 408 is open. However, when opening 408 is closed, openings 410 and 412 will open to allow exhaust gas to exit the reactor chamber. During deposition, precursor-gas-inlet component 402 and exhaust component 404 alternately turn on, and together with another nozzle similar to nozzle 400 located on the opposite side of the reactor chamber, the precursor gas can be injected into the narrow channel within the reactor chamber from two directions alternately to ensure a uniform deposition on the wafers surrounding the narrow channel. In FIG. 4A, the flow direction of the precursor gas is illustrated by an arrow 418, and the flow direction of the exhaust gas is illustrated by arrows 420 and 422.

Purge-gas-inlet component 406 is stacked around exhaust component 404. In one embodiment, the inner walls of purge-gas-inlet component 406 and the outer walls of exhaust component 404 form an enclosed space to allow the flow of the purge gas. In a further embodiment, purge-gas-inlet component 406 includes a number of openings, such as openings 414 and 416, at the bottom. These openings are coupled to the space between the back sides of the susceptors and the walls of the reactor chamber. As a result, the purge gas, such as $H_2$, can flow between the back sides of the susceptors and the chamber walls, thus preventing unwanted deposition on the chamber walls. In FIG. 4A, arrows 424 and 426 illustrate the flow direction of the purge gas.

Figure 4B:
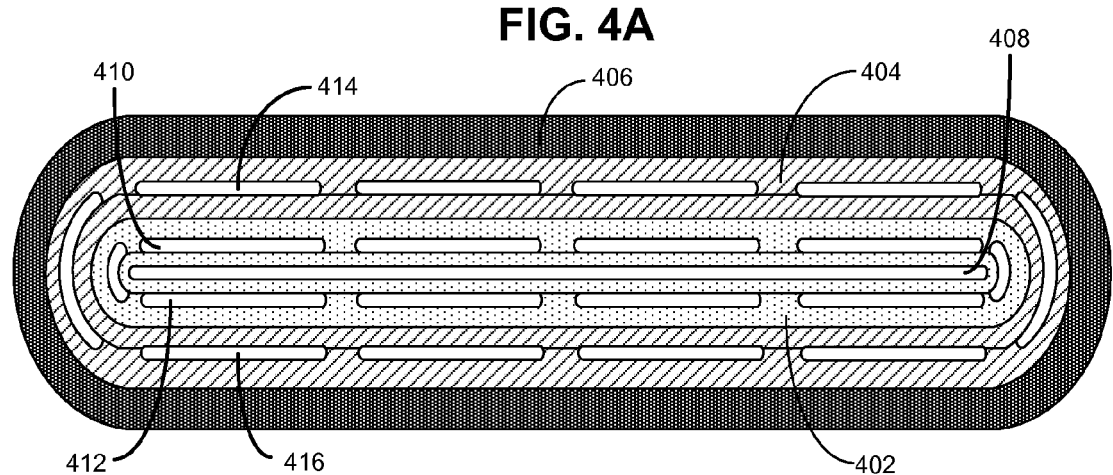
FIG. 4B presents the cross-sectional view of a nozzle in the horizontal direction in accordance with an embodiment of the present invention.

FIG. 4B presents the cross-sectional view of a nozzle in the horizontal direction in accordance with an embodiment of the present invention. From FIG. 4B, one can see that opening 408 for the precursor-gas-inlet component is located at the center of nozzle 400. During operation, precursor gas can be injected into the reactor chamber via opening 408. By carefully aligning opening 408 with the narrow channel formed by the susceptors, the system contains the precursor gas within the narrow channel, thus improving the utilization of the precursor gas. In addition, the containment of the precursor gas within the narrow channel also prevents the deposition on the chamber walls. Note that the shape of opening 408 is not limited to the one illustrated in FIG. 4B.

FIG. 4B also illustrates that openings for the exhaust component, such as openings 410 and 412, are located surrounding opening 408. These openings and opening 408 open alternately to allow the exhaust gas to exit the reactor chamber. Note that the number of openings included in the exhaust component can be more or fewer than in the example shown in FIG. 4B. In addition, the shapes of the openings included in the exhaust component are not limited to the ones shown in FIG. 4B.

In FIG. 4B, openings for the purge-gas-inlet component, such as openings 414 and 416, are located surrounding openings for the exhaust component. These openings allows the purge gas, such as $H_2$, to be injected between the back side of the susceptor and the chamber walls, thus reducing unwanted deposition on the chamber walls. The gas pressure between the back sides of the susceptors and the chamber walls can be kept equal or more than the gas pressure inside the narrow channel formed by the susceptors, thus preventing the precursor gas contained in the narrow channel to leak into the space next to the chamber wall. Note that the number of openings included in the purge-gas-inlet component can be more or fewer than the example shown in FIG. 4B. In addition, the shapes of the openings included in the purge-gas-inlet component are not limited to the ones shown in FIG. 4B.

Figure 4C:
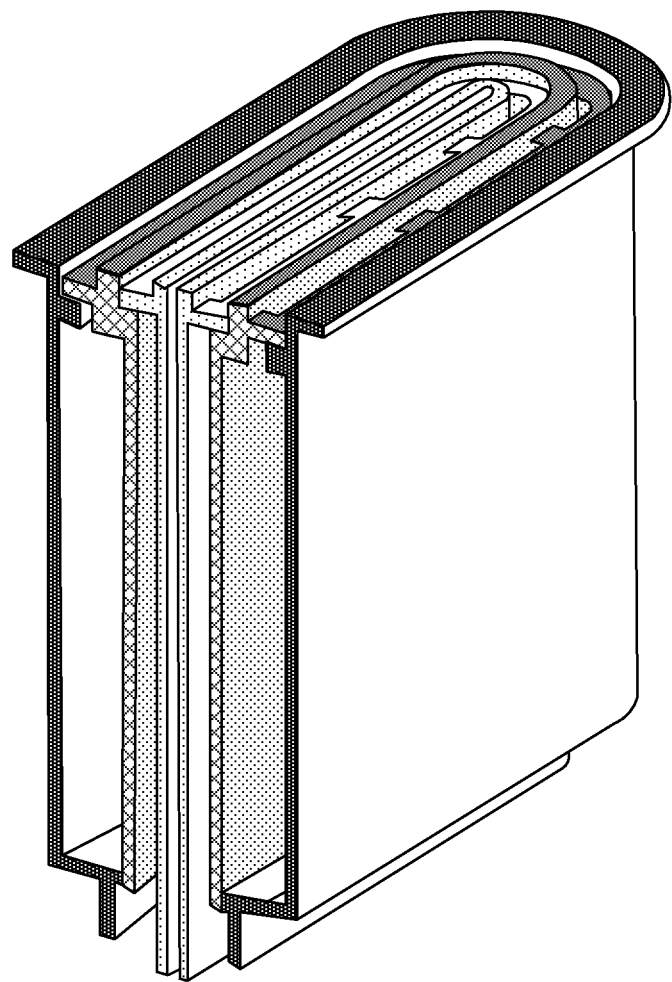
FIG. 4C presents a three-dimensional view of a stackable multi-port nozzle in accordance with an embodiment of the present invention.

FIG. 4C presents a three-dimensional view of a stackable multi-port nozzle in accordance with an embodiment of the present invention.

Having stackable components makes the manufacture and the maintenance of the nozzle much easier. Each component can be manufactured separately, which significantly lowers the cost. In addition, if one component breaks down, the system operator only needs to replace the faulty component instead of replacing the whole nozzle, which is much more expensive.

Note that, although this disclosure gives an example of a nozzle with three stackable components, other configurations with fewer or more stackable components are also possible. Also note that, although in the example shown in FIGS. 4A-4C the stackable components are concentric to each other, the relative configurations of the stackable components are not limited to concentric. For example, it is possible for one or more stable components to be off center from each other as long as the components provide appropriate channels for the flow of gases. In addition to placing such stackable nozzles on the top and bottom of the reactor chamber, it is also possible to place fewer or more such nozzles at other locations surrounding the reactor chamber.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A gas nozzle system for depositing material in a reactor chamber that accommodates at least two susceptors situated inside the reactor chamber, comprising:
  a gas-inlet component situated inside the gas nozzle system, wherein inner walls of the gas-inlet component form a first enclosed space that has at least one input-opening that opens to the reactor chamber, and wherein the gas-inlet component is configured to inject precursor gases into the reactor chamber via the input-opening; and
  a gas-outlet component stacked around and substantially enclosing the gas-inlet component, wherein inner walls of the gas-outlet component and outer walls of the gas-inlet component form a second enclosed space that has at least one output-opening that open to the reactor chamber, wherein the gas-outlet component is configured to output exhaust gases from the reactor chamber via the output-openings, wherein the output-opening is situated around the input-opening, and wherein the input-opening and the output-opening surrounding the input-opening are configured to open alternately, thereby enabling a uniform material deposition;
  wherein the gas-nozzle system is coupled to the susceptors in the reactor chamber in such a way that the gas-inlet component injects precursor gas into a narrow channel formed by two susceptors facing each other situated within the reactor chamber.

2. The gas nozzle system of claim 1, further comprising a second gas-inlet component stacked around the gas-outlet component, wherein the second gas-inlet component comprises a plurality of purge-openings open to the reactor chamber, wherein the plurality of the purge-openings are situated around the plurality of output-openings and wherein the second gas-inlet component is configured to inject purge gas into the reactor chamber via the plurality of purge openings, thereby reducing deposition on sidewalls of the reactor chamber.

3. The gas nozzle system of claim 2, wherein the second gas-inlet component is configured to inject the purge gas into a space between the sidewalls of the reactor chamber and a back-side surface of a susceptor situated within the reactor chamber.

4. The gas nozzle system of claim 2, wherein the purge gas flows between an inner wall of the second gas-inlet component and an outer wall of the gas-outlet component.

5. The gas nozzle system of claim 1, wherein at least one component is made of a material that comprises quartz.

6. A reactor for material deposition, comprising:
  a chamber comprising a pair of susceptors situated inside the chamber, wherein each susceptor has a front side and a back side, wherein the front side mounts a number of substrates, wherein the susceptors are positioned vertically in such a way that the front sides of the susceptors face each other, and wherein the vertical edges of the susceptors are in contact with each other, thereby forming a substantially enclosed narrow channel between the substrates mounted on different susceptors; and
  at least one gas nozzle system coupled to the chamber, wherein the gas nozzle system comprises:
    a gas-inlet component situated inside the gas nozzle system, wherein inner walls of the gas-inlet component form a first enclosed space that has at least one input-opening that opens to the chamber, and wherein the gas-inlet component is configured to inject precursor gases into the chamber via the input-opening; and
    a gas-outlet component stacked around and substantially enclosing the gas-inlet component, wherein inner walls of the gas-outlet component and outer walls of the gas-inlet component form a second enclosed space that has at least one output-opening that open to the chamber, wherein the gas-outlet component is configured to output exhaust gases from the chamber via the output-openings, wherein the output-opening is situated around the input-opening, and wherein the input-opening and the output-opening surrounding the input-opening are configured to open alternately, thereby enabling a uniform material deposition;
  wherein the gas-inlet component and the gas-outlet component are separable from the chamber and the susceptors.

7. The reactor of claim 6, wherein the susceptors are formed using at least one of: SiC-coated graphite and monolithic SiC.

8. The reactor of claim 6, wherein the cross section of the susceptors is U-shaped, and wherein the wafer-holding sides of the susceptors are inner surfaces of the "U."

9. The reactor of claim 6, wherein the chamber is made of a material that comprises quartz.

10. The reactor of claim 6, wherein the gas nozzle system further comprises a second gas-inlet component stacked around the gas-outlet component, wherein the second gas-inlet component comprises a plurality of purge-openings open to the chamber, wherein the plurality of the purge-openings are situated around the plurality of output-openings, and wherein the second gas-inlet component is configured to inject purge gas into the chamber via the plurality of purge-openings, thereby reducing deposition on sidewalls of the chamber.

11. The reactor of claim 10, wherein the second gas-inlet component is configured to inject the purge gas into a space between the sidewalls of the chamber and the back-side surfaces of the susceptors.

12. The reactor of claim 10, wherein the purge gas flows between an inner wall of the second gas-inlet component and an outer wall of the detachable gas-outlet component.

13. The reactor of claim 6, wherein at least one component of the gas nozzle system is made of a material that comprises quartz.

14. An apparatus, comprising:
  means for injecting precursor gases into a reactor chamber via a gas-inlet component, wherein inner walls of the gas-inlet component form a first enclosed space that has at least one input-opening that opens to the chamber;
  means for outputting exhaust gases from the reactor chamber via a gas-outlet component stacked around and substantially enclosing the gas-inlet component, wherein inner walls of the gas-outlet component and outer walls of the gas-inlet component form a second enclosed space that has at least one output-opening that open to the reactor chamber, wherein the output-opening is situated around the input-opening, wherein the input-opening and the output-opening surrounding the input-opening are configured to open alternately, thereby enabling a uniform material deposition; and
  means for injecting purging gases into the reactor chamber via a second gas-inlet component stacked around the gas-outlet component;
  wherein both the gas-inlet component and the gas-outlet component are separable from the reactor chamber and the susceptors; and
  wherein the gas-inlet component is coupled to the susceptors in the reactor chamber in such a way that the gas-inlet component injects precursor gas into a narrow channel formed by two susceptors facing each other situated within the reactor chamber.

\* \* \* \* \*